US008445838B1

(12) United States Patent
Bixler et al.

(10) Patent No.: US 8,445,838 B1
(45) Date of Patent: May 21, 2013

(54) SYSTEM AND METHOD FOR GENERATING A DESELECT MAPPING FOR A FOCAL PLANE ARRAY

(75) Inventors: Jay V. Bixler, Lafayette, CA (US); Timothy G. Brandt, Manteca, CA (US); James L. Conger, San Ramon, CA (US); Janice K. Lawson, Tracy, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 998 days.

(21) Appl. No.: 12/365,839

(22) Filed: Feb. 4, 2009

(51) Int. Cl.
*G01J 5/00* (2006.01)
*G01J 5/02* (2006.01)
(52) U.S. Cl.
USPC ........... 250/252.1; 250/339.01; 250/339.06; 348/241; 348/243; 348/245
(58) Field of Classification Search
USPC . 348/241, 243, 245–247, E5.081; 250/214 R, 250/252.1, 339.06, 339.01, 208.1
See application file for complete search history.

(56) References Cited

U.S. PATENT DOCUMENTS

| | | | | |
|---|---|---|---|---|
| 5,850,623 A | * | 12/1998 | Carman et al. | 702/28 |
| 6,035,072 A | * | 3/2000 | Read | 382/275 |
| 2004/0061785 A1 | * | 4/2004 | Aufrichtig et al. | 348/207.99 |
| 2006/0170801 A1 | * | 8/2006 | Dennis et al. | 348/294 |
| 2007/0176082 A1 | * | 8/2007 | Lee et al. | 250/214 R |
| 2008/0174683 A1 | * | 7/2008 | Kiba et al. | 348/246 |
| 2009/0092321 A1 | * | 4/2009 | Liberman et al. | 382/224 |

OTHER PUBLICATIONS

Conger, James L.; "DS2 Spectrometer Sub-Pixel Selection Map Generation", University of California, Lawrence Livermore National Laboratory, UCRL-TR-216905, Nov. 3, 2005.

* cited by examiner

*Primary Examiner* — David Porta
*Assistant Examiner* — Djura Malevic
(74) *Attorney, Agent, or Firm* — Dominic M. Kotab

(57) ABSTRACT

A method for generating a deselect mapping for a focal plane array according to one embodiment includes gathering a data set for a focal plane array when exposed to light or radiation from a first known target; analyzing the data set for determining which pixels or subpixels of the focal plane array to add to a deselect mapping; adding the pixels or subpixels to the deselect mapping based on the analysis; and storing the deselect mapping. A method for gathering data using a focal plane array according to another embodiment includes deselecting pixels or subpixels based on a deselect mapping; gathering a data set using pixels or subpixels in a focal plane array that are not deselected upon exposure thereof to light or radiation from a target of interest; and outputting the data set.

33 Claims, 9 Drawing Sheets

SYSTEM AND METHOD FOR GENERATING A DESELECT MAPPING FOR A FOCAL PLANE ARRAY

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to light and radiation detection, and more particularly to optimizing functionality of focal plane arrays used for such detection.

BACKGROUND

Focal plane arrays (FAA) are sensing devices including of an array of light or other radiation sensing pixels, typically placed at a focal plane of a lens. Focal plane arrays are used for imaging purposes (e.g. taking pictures or video imagery, etc.) and for non-imaging purposes such as spectrometry, light detection and ranging (LIDAR), and wave-front sensing, etc. Focal plane arrays typically operate by detecting photons at particular wavelengths and then generating an electrical charge, voltage, or resistance in relation to the number of photons detected at each pixel. This charge, voltage, or resistance may then be measured, digitized, and used for image generation or analysis, etc.

In many sensing applications, the sensitivity and efficiency of pixels in the focal plane array is a factor in the overall performance of the sensing system. Some focal plane arrays are produced such that some pixels behave in an undesirable manner (e.g. at high and/or unstable background currents, etc.). In other words, the number of pixels from which usable information can be extracted may be reduced. These badly behaved pixels lower the operability of the detector. There is thus a need for addressing these and/or other issues.

SUMMARY

A method for generating a deselect mapping for a focal plane array according to one embodiment includes gathering a data set for a focal plane array when exposed to light or radiation from a first known target; analyzing the data set for determining which pixels or subpixels of the focal plane array to add to a deselect mapping; adding the pixels or subpixels to the deselect mapping based on the analysis; and storing the deselect mapping.

A method for gathering data using a focal plane array according to another embodiment includes deselecting pixels or subpixels based on a deselect mapping; gathering a data set using pixels or subpixels in a focal plane array that are not deselected upon exposure thereof to light or radiation from a target of interest; and outputting the data set.

A method according to yet another embodiment includes analyzing responses of pixels or subpixels of a focal plane array to a known target; deselecting some of the pixels or subpixels based on the analysis; exposing the focal plane array to light or radiation from a target of interest; generating a target data set representative of the target of interest; and outputting the target data set.

Other aspects and embodiments of the present invention will become apparent from the following detailed description, which, when taken in conjunction with the drawings, illustrate by way of example the principles of the invention.

DETAILED DESCRIPTION

Figure 1:
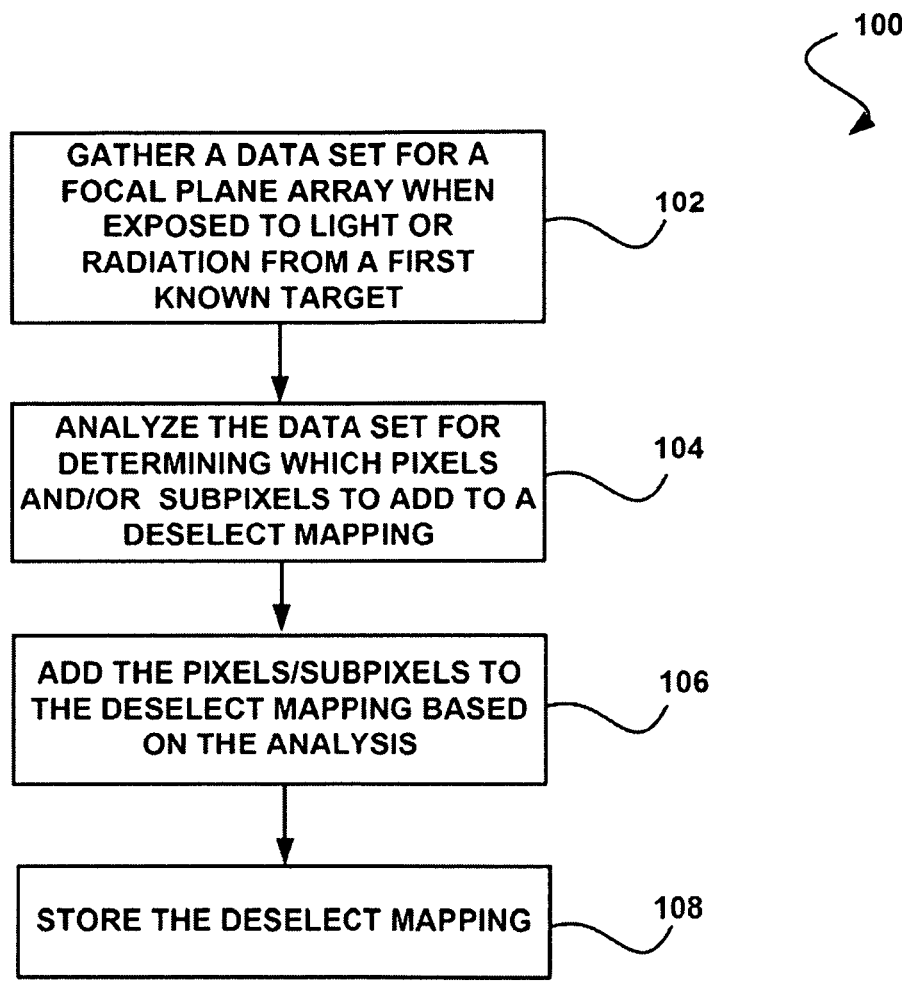
FIG. 1 shows a method for generating a deselect mapping for a focal plane array, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Focal plane arrays for use in long wave infrared (LWIR) sensing may be constructed with a photosensitive layer fabricated from Mercury-Cadmium-Telluride (HgCdTe) or other material. This material may be used because the LWIR sensitivity of the material can be maintained with a reasonably low thermal dark current at relatively high operating temperatures, thus easing cooling requirements for the focal plane array. In some cases, HgCdTe sensing layers may be difficult to produce and may have randomly located crystalline defects that cause the affected location to behave badly (e.g. at high and/or unstable background currents, etc.). These badly behaved pixels may lower the operability of the detector. In other words, the number of pixels from which usable information can be extracted may be reduced.

To mitigate this problem, in some embodiments, each focal plane array pixel may be segmented into subpixels that can be individually turned on or off (i.e. deselected). For example, a focal plane array with this feature may include a plurality of pixels where each pixel is segmented into four subpixels (e.g. A, B, C, and D). In other embodiments, groups of pixels may be segmented into individual pixels or sub-groups of pixels that can be individually turned on or off.

The deselect feature allows pixels with a material defect that would ordinarily render the focal plane array into a low functioning state to be salvaged by turning, off the subpixel where the defect is located. The remaining subpixels may function together. At least some embodiments of the present invention addresses this limitation by providing techniques for producing a low defect deselect mapping for this type of focal plane array when coupled to an LWIR spectrometer fore optic. The same logic may be applied to focal planes which do not have sub-pixels, although the granularity of the deselect map will be more course where only whole-pixels are available.

In one general embodiment, a method for generating a deselect mapping for a focal plane array is provided. In operation, a data set is gathered for a focal plane array when exposed to light or radiation from a first known target. Additionally, the data set is analyzed for determining which of the pixels/subpixels to add to a deselect mapping. Furthermore, subpixels/pixels are added to the deselect mapping based on the analysis. The deselect mapping is stored.

In another general embodiment, a method for gathering data using a focal plane array is provided. In operation, pixels/subpixels are deselected based on a deselect mapping. Additionally, a data set is gathered using pixels/subpixels in a focal plane array that are not deselected upon exposure thereof to light or radiation from a target of interest. Furthermore, the data set is output.

In another general embodiment, a method for outputting target data is provided. In operation, responses of pixels/subpixels of a focal plane array to a known target are analyzed. Additionally, some of the pixels/subpixels are deselected based on the analysis. Furthermore, the focal plane array is exposed to light or radiation from a target of interest. Still yet, a target data set representative of the target of interest is generated. Moreover, the target data set is output.

More illustrative information will now be set forth regarding various optional architectures and features with which the foregoing framework may or may not be implemented, per the desires of the designers or user. It should be strongly noted that the following information is set forth for illustrative purposes and should not be construed as limiting in any manner. Any of the following features may be optionally incorporated with or without the exclusion of other features described.

For clarity and to aid in the understanding of the reader, the following description is primarily set forth in terms of subpixels of a pixel. However, it is to be understood that the same logic, operations, and effects may be applied to individual pixels or sub-groups of pixels in larger groups of pixels. Thus, the embodiments described herein are also intended to include such embodiments as well.

FIG. 1 shows a method 100 for generating a deselect mapping for a focal plane array, in accordance with one embodiment. As shown, a data set is gathered for multiple sets of subpixels in a focal plane array (FPA) when exposed to light or radiation from a first known target. See operation 102.

The data set may include any configuration of data for the multiple sets of subpixels in the focal plane array. For example, in one embodiment, the data set may include one or more frames of data. In the context of the present description, a frame of data refers to any numerical array of row and column output values from a two dimensional focal plane array. For example, when a focal plane array is coupled to a dispersive spectrometer, the data frame may include data in one spatial and one spectral dimension. Of course, this is merely an example of the data that may be included in a frame as the focal plane array is not limited to being coupled to a dispersive spectrometer.

In the case that the data set includes more than one frame of data, the more than one frame of data may comprise a data cube. In the context of the present description, a data cube refers a data set including a sequential capture of focal plane array frames in time. Thus, the data cube may include a three dimensional numerical data set.

In one embodiment, the data cubes may be acquired by viewing laboratory blackbodies through a dispersive spectrometer. In this case, the data cube may include a spatial, a spectral, and a temporal component and dimension representation. Furthermore, in the context of the present description, a subpixel refers to any segmented portion of a pixel, or any individual pixel or block of pixels within a larger group of pixels.

Still yet, the focal plane array may include any detector that may be utilized to detect light or other radiation. In one embodiment, the focal plane array may include a layer of HgCdTe or any other known photon or radiation sensing material. Additionally, the focal plane array may be cooled during or before operation. For example, the focal plane array may be cooled prior to gathering the data set. For optimum performance, the method 100 of FIG. 1 may be performed each time the focal plane array is cooled. However, this is not necessary.

Once the data set is gathered, the data set is analyzed for determining which of the subpixels to add to a deselect mapping. See operation 104. In one embodiment, the analysis may include determining which subpixels have an output greater than a threshold.

In this case, the comparison to the threshold may be a direct comparison to the threshold, determining whether the output is inside or outside a range, and/or any other comparison for determining which subpixels have an output greater than a threshold. Additionally, the threshold may include a user defined threshold or an automatically calculated threshold. Furthermore, the threshold may include a static or dynamic threshold.

For example, in one embodiment, the threshold may vary with spectral dispersion of the light or radiation. In this case, the spectral dispersion may include spectral dispersion across the focal plane array. In another embodiment, the threshold may be based at least in part on a statistical output level of at least some of the subpixels. The statistical output level may include any statistical output level such as a mean output level, a median output level, an average output level, and/or any other statistical output level.

Once the data set is analyzed, subpixels are added to the deselect mapping based on the analysis. See operation 106. In the context of the present description, a deselect mapping refers to any information or structure capable of being utilized to deselect subpixels, groups of subpixels, and pixels, etc. In this case, deselecting subpixels refers to any technique of avoiding the use or access of such subpixels or data from such subpixels.

Once the subpixels are added to the deselect mapping, the deselect mapping is stored. See operation 108. In this case, the deselect mapping may be stored for any amount of time. For example, in one embodiment, the deselect mapping may be stored for at least long enough for testing purposes, a subsequent use of the focal plane array, and/or any other amount of time determined by a system, program, or user.

In addition to gathering the first initial data set, in one embodiment, a second data set may be gathered from multiple sets of the subpixels exposed to light or radiation from a second known target having a different temperature than the first known target. In this case, the analysis may include using the data sets to determine which of the subpixels has a difference response lower than a threshold. The subpixels having a difference response lower than the threshold may be added to the deselect mapping. As an option, the analysis may also include determining a noise value of the subpixels, and determining which subpixels have a noise level greater than a threshold.

Figure 2:
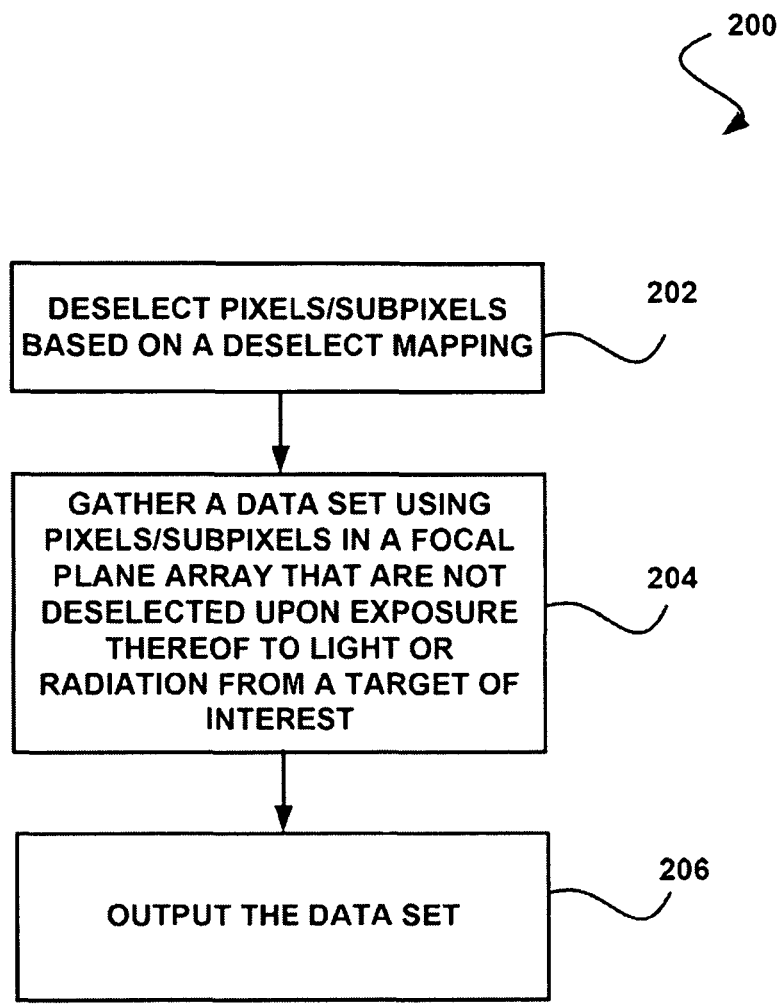
FIG. 2 show a method for gathering data using a focal plane array, in accordance with one embodiment.

Using the stored deselect mapping, pixels or subpixels of the focal plane array may be deselected and a resulting data set may be output. FIG. 2 show a method 200 for gathering data using a focal plane array, in accordance with one embodiment. As an option, the method 200 may be implemented in the context of the details of FIG. 1. Of course, however, the method 200 may be implemented in any desired environment. It should also be noted that the aforementioned definitions may apply during the present description.

As shown, pixels or subpixels are deselected based on a deselect mapping. See operation 202. In one embodiment, the deselect mapping may be a stored deselect mapping. In another embodiment, the deselect mapping may be generated. As an option, the deselect mapping may be generated utilizing the method 100 described in FIG. 1.

A data set may then be gathered using pixels or subpixels in a focal plane array that are not deselected upon exposure thereof to light or radiation from a target of interest. See operation 204. The data set may then be output. See operation 206.

Using these techniques, a subpixel architecture of a focal plane array may be exploited to optimize pixel operability on the focal plane array. For example, pixel operability may be optimized for a LWIR sensitive HgCdTe focal plane array with a subpixel architecture when employed in a long wave (e.g. 8-12 micron wavelength, etc.) infrared spectrometer. In this case, blackbody calibration data sets may be collected with each separate subpixel array activated, to determine an optimal in-use subpixel combination. This may be reflected in a deselect map that may be utilized when collecting a data set. As noted above, the data set may include a data cube.

Figure 3:
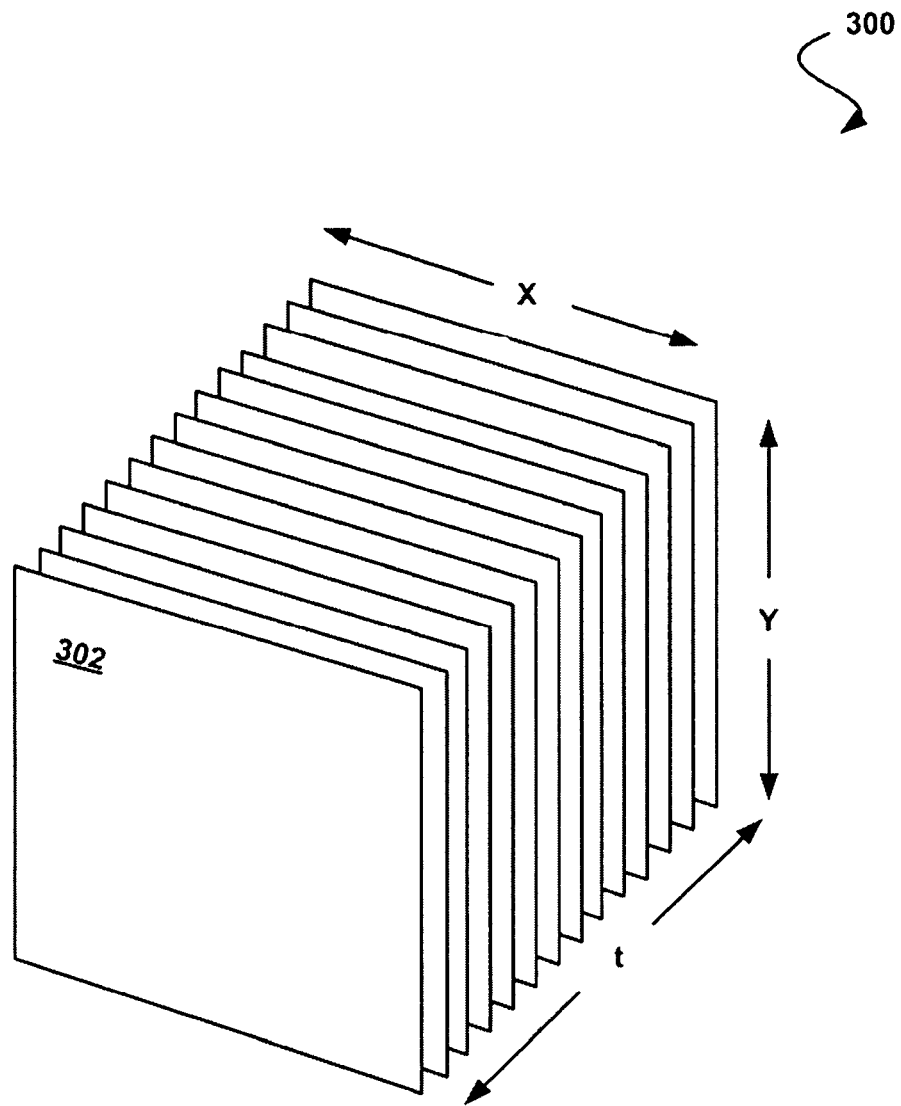
FIG. 3 show a representation of a data cube gathered using a focal plane array, in accordance with one embodiment.

FIG. 3 show a representation 300 of a data cube gathered using a focal plane array, in accordance with one embodiment. As an option, the representation 300 may be viewed in the context of the details of FIGS. 1-2. Of course, however, the representation 300 may be viewed in the context of any desired environment. Again, the aforementioned definitions may apply during the present description.

As shown, the data cube includes a sequential capture of focal plane array frames 302 in time (t). Thus, the data cube may include a three dimensional numerical data set. In one embodiment, the data cube may be acquired by viewing laboratory blackbodies through a dispersive spectrometer. In this case, the data cube may include a spatial dimension (X dimension), a spectral dimension (Y dimension), and a temporal dimension (t dimension). Furthermore, the data frame may include data in the spatial and spectral dimensions.

In one embodiment, a predetermined number of data cubes may be collected with a spectrometer (e.g. 100, 200, etc. data cubes). For example, using the case where each full pixel is composed of four subpixels, it may be determined to collect eight data cubes with the spectrometer. In this case, four data cubes may be collected with the spectrometer viewing a hot (e.g. ~50 degrees C., etc.) blackbody, and four data cubes may be collected with the spectrometer viewing a cold (e.g. ~20 degrees C., etc.) blackbody.

Each data cube may be configured to include a predetermined number of frames. For example, in one embodiment, each data cube may be configured to include 100 frames. For both the hot and cold data collections, the data cubes may be collected with the focal plane array configured to activate only one subpixel at a time. For example, if a pixel is segmented into four subpixels, A, B, C, and D, the focal plane array may activate the A subpixel, then the B subpixel, followed by the C subpixel, and finally the D subpixel.

As an option, the first two deselect discrimination steps may be based on the focal plane array output levels. For example, the data cubes may be averaged along the temporal (t) dimension into single frames holding the average row and column output levels. The output levels may vary with column/wavelength (Y) position since the column direction is the direction of spectral dispersion and the overall instrument throughput varies with wavelength.

In this case, as a first step, the median output level versus a focal plane array column location may be computed using the hot subpixel (e.g. A, B, C, and D) data sets. Because the general output level may vary with column position, the median value may be computed for each column location rather than as a single global focal plane array value. The first deselect discriminator may be set at the median subpixel output value plus a user specified count offset. The offset level may be user determined based on the point where the distribution of subpixel output levels transition to an outlier population. Subpixels in a given focal plane array column with levels above the column median plus the offset value may be deselected and recorded into the deselect map.

A second level discrimination based on focal plane array responsivity may also be performed. Using the hot and cold average frame for each subpixel, a difference frame may be computed by subtracting the cold average frame from the hot average frame. The difference frame may be examined for locations where the value is below a user defined number of counts (e.g. which may be close to zero in one embodiment, etc.) and those subpixels may be deselected. In this way, extremely low response or unresponsive subpixels may be identified. These low response or unresponsive subpixels may then be added into the deselect map.

As an option, a third discrimination step may be performed. In one embodiment, the third discrimination may be based on subpixel noise level. A temporal root-mean-square (RMS) fluctuation may be computed for each subpixel. The hot data cubes may be used for this computation. Thus, in this example, the result may be four data frames, one each for the A, B, C, and D subpixel selections, where each frame holds the RMS noise values. The median value of noise may be computed for groups of subpixels binned into a predetermined number of output intervals (e.g. sixteen, etc.).

The third deselect discriminator may be set at the median subpixel noise value plus a user specified count offset. In one embodiment, the offset level may be user defined based on the point where the distribution of subpixel noise levels transition to an outlier population. Subpixels in a given output level interval with noise values above the interval median plus the offset value may be deselected and recorded into the deselect map.

Using this technique, the number of saturated and near saturated pixels may be reduced (e.g. from several hundreds to zero for a 258 by 256 pixel array, etc.). Additionally, the number of excessively noisy pixels may be reduced (e.g. from greater than two thousand to less than forty in a 258 by 253 pixel array, etc.).

Figure 4:
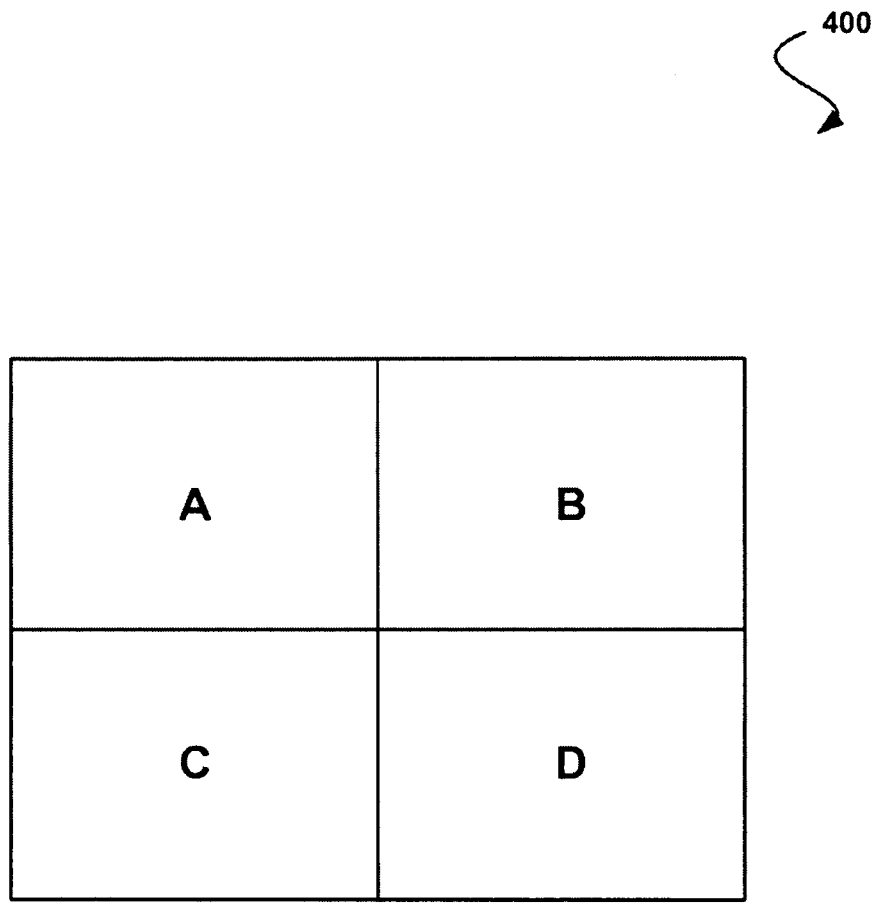
FIG. 4 shows a representative focal plane array pixel for gathering data, in accordance with one embodiment.

FIG. 4 shows a representative focal plane array pixel 400 for gathering data, in accordance with one embodiment. As an option, the focal plane array pixel 400 may be implemented in the context of the details of FIGS. 1-3. Of course, however, the focal plane array pixel 400 may be implemented in any desired environment. The aforementioned definitions may apply during the present description.

As shown, the focal plane array pixel 400 may be divided into subpixels A, B, C, and D. The focal plane array may include a plurality of pixels where each is divided into subpixels A, B, C, and D. Of course, in various other embodiments, the focal plane array pixel 400 may be divided into any number of subpixels (e.g. 2, 4, 6, 8, etc.).

In this way, each subpixel may be individually turned on or off to eliminate subpixels that have excessive noise/dark current or an abnormally low response. A deselect map may include a pixel by pixel mapping of which subpixels are turned on or off. In one embodiment, a new deselect map may be generated for every cool down cycle of the focal plane array.

As an option, the deselecting of subpixels may begin with eliminating unusually high output level subpixels. This may be accomplished using an initial deselect discrimination performed on the basis of subpixel output levels viewing hot and cold blackbodies. Subpixels with signal levels above a pixel output read count equal to a column median plus a predefined offset may be deselected.

In this way, the threshold for the deselect may be subjective but may be used to eliminate outliers from a normal population. Furthermore, subpixels with a cold signal greater than a hot signal may be deselected.

Figure 5:
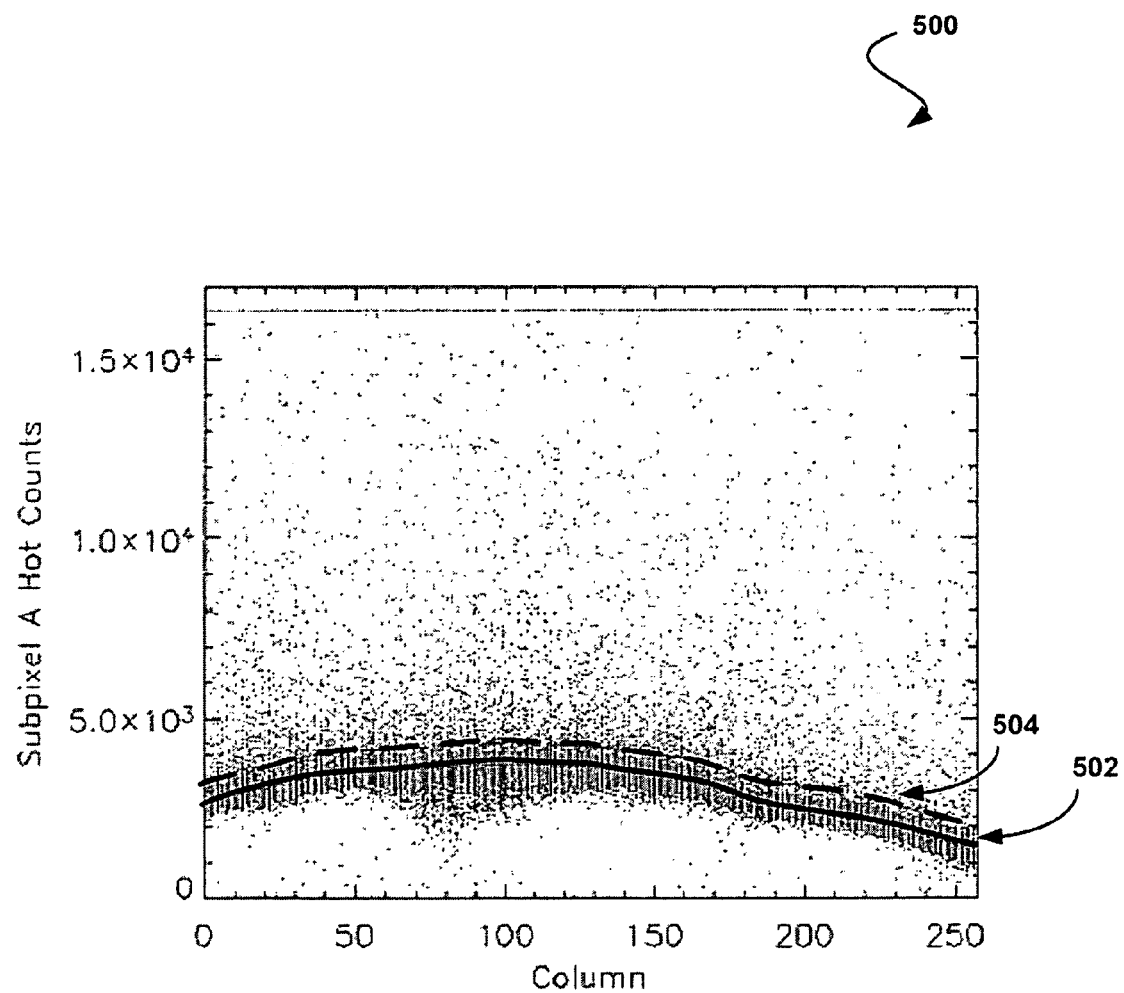
FIG. 5 shows data representative of one subpixel for a first deselection step, in accordance with one embodiment.

FIG. 5 shows data 500 representative of one subpixel (e.g. subpixel A, etc.) for a first deselection step, in accordance with one embodiment. As shown, a solid line 502 represents a median column value. A dashed line 504 represents the median plus a user defined offset. In this case, subpixels above the median plus a user defined offset (dashed line 504) may be deselected as part of a first deselection step. Similar data sets may be examined and analyzed for the remainder of the subpixels (e.g. subpixels B, C, and D, etc.).

A second level deselect may also be performed on the basis of responsivity. In this case, the lowest level normal output difference may be determined. For example, in one specific embodiment, this may be approximately 400 counts at a 30 Hz frame rate with a 33 millisecond integration time, at a temperature of approximately 30° C.

In this specific case, as an example, subpixels with responsivities less than 100 counts may be deselected. The threshold for this deselect may be based on user discretion with an ultimate goal of eliminating abnormally or low/no response pixels. The number of pixels deselected may vary in different focal plane arrays. For example, the number of pixels deselected may depend on the presence of dead spots on the focal plane array.

Figure 6:
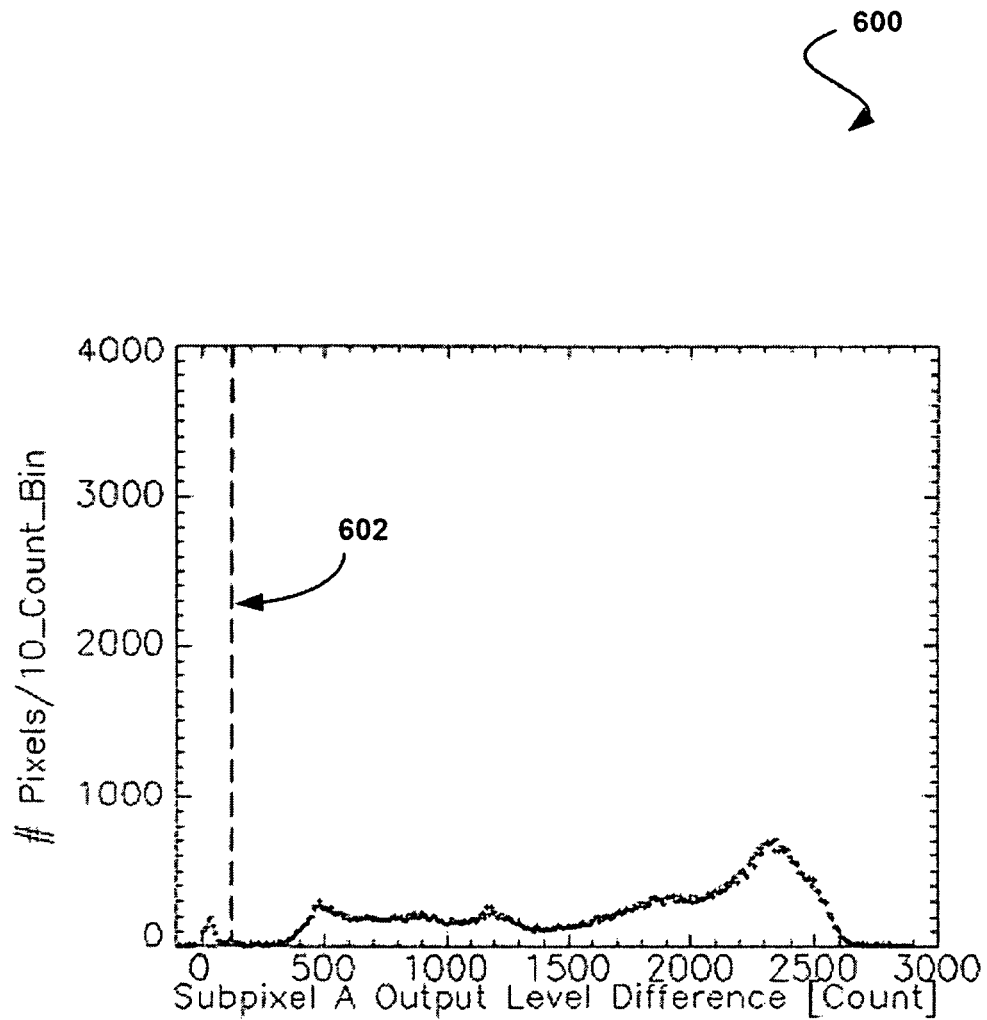
FIG. 6 shows data representative of one subpixel for a second deselection step, in accordance with one embodiment.

FIG. 6 shows data 600 representative of one subpixel (e.g. subpixel A, etc.) for a second deselection step, in accordance with one embodiment. In this case, subpixels having value below a threshold, represented as dashed line 602, may be deselected. Similar data sets may be examined and analyzed for the remainder of the subpixels (e.g. subpixels B, C, and D, etc.).

As another option, a third deselect step may be performed on the basis of a noise level. In this case, subpixels with noise levels above the median noise plus a predetermined number of counts (e.g. 1.0 counts, etc.) may be deselected.

Figure 7:
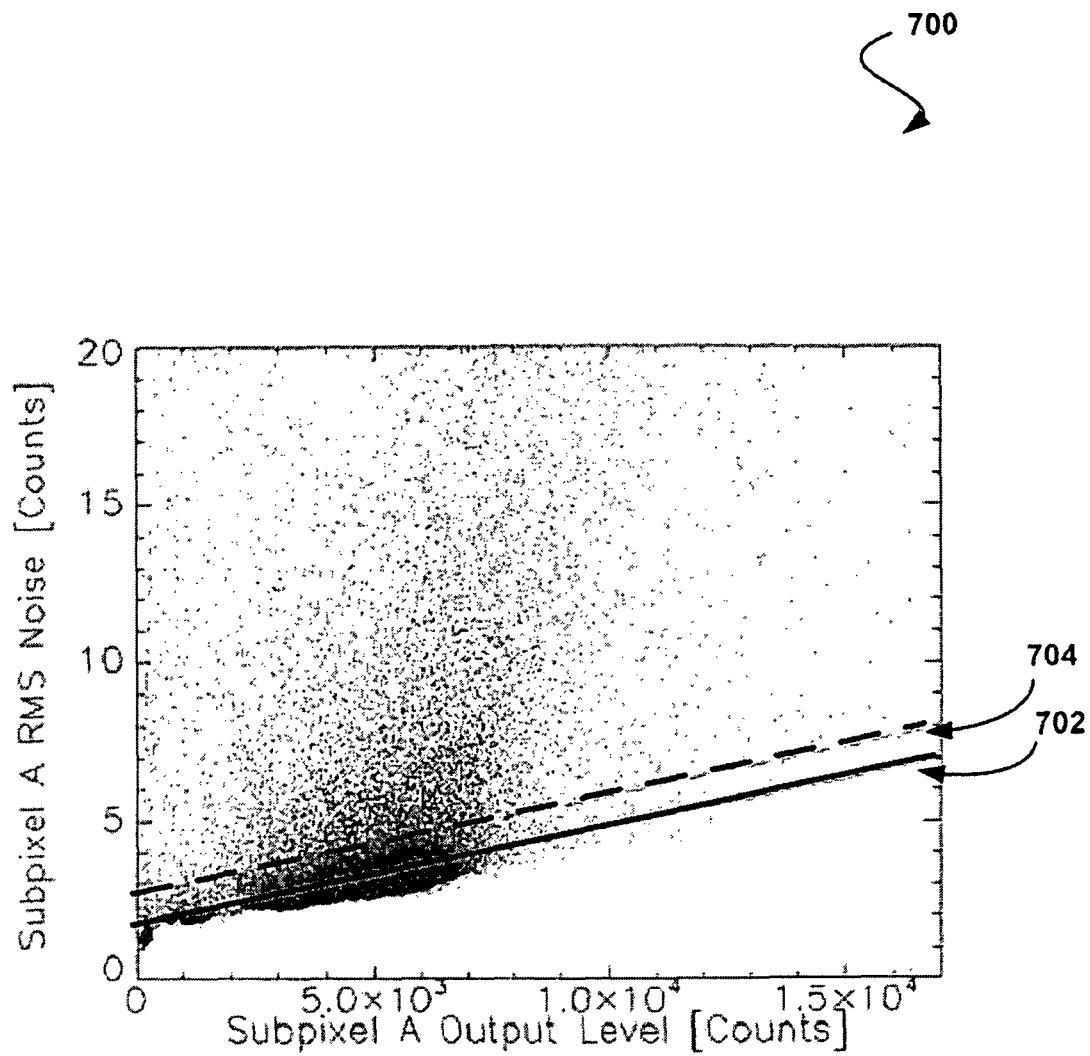
FIG. 7 shows data representative of one subpixel for a third deselection step, in accordance with one embodiment.

FIG. 7 shows data 700 representative of one subpixel (e.g. subpixel A, etc.) for a third deselection step, in accordance with one embodiment. As shown, a solid line 702 represents a median noise value. A dashed line 704 represents the median plus a user defined offset. In this case, subpixels having a noise value above the median plus a user defined offset (dashed line 704) may be deselected as part of the third deselection step. Similar data sets may be examined and analyzed for the remainder of the subpixels (e.g. subpixels B, C, and D, etc.).

Applying level and noise deselect criteria may be utilized to improve focal plane array performance. A number of excessively noisy pixels may be reduced. Additionally, high dark current and saturated pixels may be eliminated.

Figures 8A, 8B:
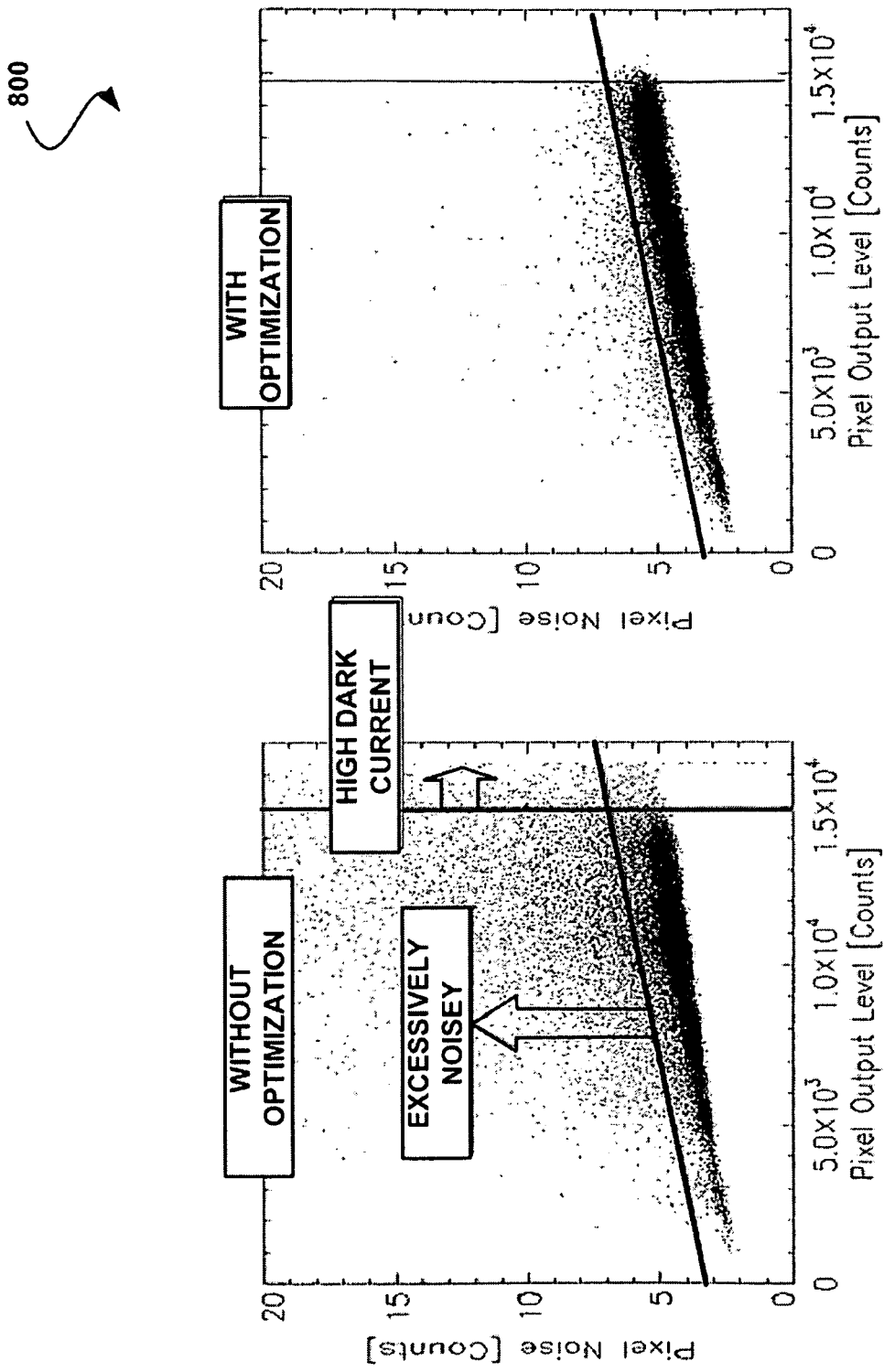
FIG. 8A shows focal plane array data before the optimization described in the context of FIGS. 4-7, in accordance with one embodiment.
FIG. 8B shows focal plane array data after the optimization described in the context of FIGS. 4-7, in accordance with one embodiment.

FIG. 8A shows focal plane array data before the optimization described in the context of FIGS. 4-7, in accordance with one embodiment. FIG. 8B shows focal plane array data after the optimization described in the context of FIGS. 4-7, in accordance with one embodiment.

As shown, utilizing the aforementioned deselection steps greatly reduces the pixel noise for given pixel output levels. Furthermore, by using this deselect technique, focal plane array output levels may have little or no population of saturated/nearly saturated pixels. Additionally, holes in data may be eliminated, which may reduce the complexity of analyzing the data. In this way, high scene temperatures may be sensed before saturation occurs.

It should be kept in mind that in various embodiments, only some of the aforementioned deselect steps may be performed, e.g., first only, second only, third only, first and second, first and third, second and third, etc. Moreover, additional and/or alternative deselect steps may also be performed.

Figure 9:
FIG. 9 shows representative statistics for pixels using the techniques described in the context of the previous figures, in accordance with one embodiment.

FIG. 9 shows representative statistics 900 for pixels using optimization described in the context of the previous figures, in accordance with one embodiment. FIG. 9 shows the percentage of subpixels that passed one and two discrimination levels. In this case, the "% level" field shows the percentage of subpixels that passed a first level filter. The "% level&noise" field shows the percentage of subpixels that passed a first level filter and a second noise level filter. Furthermore, both are shown for a plurality of subpixel combinations.

Viewing the box on the right hand side of the drawing, 0.9% of the pixels in a focal plane array were shut off completely, 0.6% of the pixels had one subpixel turned on, 4.0% had two subpixels turned on, 23.9% had 3 subpixels turned on, and 70.6% had all 4 subpixels turned on. It should be noted that this is only one representative example for a particular embodiment and such representation should not be construed as limiting in any manner.

Additionally, the subpixels are not limited to four pixels, but rather may have any practical number. For instance, each pixel may have two, four, six, eight, etc. subpixels. Moreover, the description herein may also be applied to groups of pixels, e.g., a cluster of four pixels that are like the aforementioned subpixels in the overall group. Responses of any number subpixels of a focal plane array to a known target may be analyzed. At least some of these subpixels may then be deselected based on the analysis. Furthermore, the focal plane array may be exposed to light or radiation from a target of interest and a target data set representative of the target of interest may be generated. The target data set may then be output. In this case, the target data may be output as raw data, as a graph, before or after further processing, to a data storage unit or display, or in any other manner.

The program environment in which a present embodiment of the invention may be executed illustratively incorporates one or more general-purpose computers or special-purpose devices. Details of such devices (e.g., processor, memory, data storage, input and output devices) are well known and are omitted for the sake of clarity.

It should also be understood that the techniques presented herein-might be implemented using a variety of technologies. For example, the methods described herein may be implemented in software running on a computer system, or implemented in hardware utilizing either a combination of microprocessors or other specially designed application specific integrated circuits, programmable logic devices, or various combinations thereof. In particular, methods described herein may be implemented by a series of computer-executable instructions residing on a storage medium such as a carrier wave, disk drive, or computer-readable medium. Exemplary forms of carrier waves may be electrical, electromagnetic or optical signals conveying digital data streams along a local network or a publicly accessible network such as the Internet. In addition, although specific embodiments of the invention may employ object-oriented software programming concepts, the invention is not so limited and is easily adapted to employ other forms of directing the operation of a computer.

Various embodiments can also be provided in the form of a computer program product comprising a computer readable medium having computer code thereon. A computer readable medium can include any medium capable of storing computer code thereon for use by a computer, including optical media such as read only and writeable CD and DVD, magnetic memory, semiconductor memory (e.g., FLASH memory and other portable memory cards, etc.), etc. Further, such software can be downloadable or otherwise transferable from one computing device to another via network, wireless link, non-volatile memory device, etc.

Additionally, some or all of the aforementioned code may be embodied on any computer readable storage media including tape, FLASH memory, system memory, hard drive, etc. Additionally, a data signal embodied in a carrier wave (e.g., in a network including the Internet) can be the computer readable storage medium.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for generating a deselect mapping for a focal plane array, the method comprising:
    gathering a data set for a focal plane array when exposed to light or radiation from a first known target;
    analyzing the data set for determining which pixels or subpixels of the focal plane array to add to a deselect mapping;
    adding the pixels or subpixels to the deselect mapping based on the analysis; and
    storing the deselect mapping to at least a nonvolatile memory,
    wherein the analysis includes determining which pixels or subpixels have an output greater than a threshold,
    wherein the threshold varies with spectral dispersion of the light or radiation.

2. The method of claim 1, wherein the threshold is based at least in part on a statistical output level of at least some of the pixels or subpixels.

3. The method of claim 1, further comprising gathering a second data set from multiple sets of the pixels or subpixels exposed to light or radiation from a second known target having a different temperature than the first known target, wherein the analysis includes using the data sets to determine which of the pixels or subpixels has a difference response lower than a first threshold, wherein the pixels or subpixels having a difference response lower than the first threshold are added to the deselect mapping.

4. The method of claim 3, wherein the analysis includes determining a noise value of the pixels or subpixels, and determining which pixels or subpixels have a noise level greater than a second threshold.

5. The method of claim 1, wherein the analysis includes determining a noise value of the pixels or subpixels, and determining which pixels or subpixels have a noise level greater than a threshold.

6. The method of claim 1, further comprising gathering a second data set from multiple sets of the pixels or subpixels exposed to light or radiation from a second known target having a different temperature than the first known target.

7. The method of claim 6, wherein the analysis includes using the data sets to determine which of the pixels or subpixels has a difference response lower than a first threshold, wherein the pixels or subpixels having a difference response lower than the first threshold are added to the deselect mapping.

8. The method of claim 7, wherein the analysis includes determining a noise value of the pixels or subpixels, and determining which pixels or subpixels have a noise level greater than a second threshold.

9. The method of claim 1, wherein focal plane array includes a layer of HgCdTe.

10. A method, for generating a deselect mapping for a focal plane array, the method comprising:
    gathering a data set for a focal plane array when exposed to light or radiation from a first known target;
    analyzing the data set for determining which pixels or subpixels of the focal plane array to add to a deselect mapping;
    adding the pixels or subpixels to the deselect mapping based on the analysis; and
    storing the deselect mapping to at least a nonvolatile memory,
    performing the method each time the focal plane array is cooled down.

11. The method of claim 10, wherein the analysis includes determining which pixels or subpixels have an output greater than a threshold.

12. The method of claim 9, wherein the threshold varies with spectral dispersion of the light or radiation.

13. A method for gathering data using a focal plane array, the method comprising:
    deselecting pixels or subpixels based on a deselect mapping;
    cooling the focal plane array prior to gathering a data set;
    gathering the data set using pixels or subpixels in a focal plane array that are not deselected upon exposure thereof to light or radiation from a target of interest; and
    outputting the data set to at least a nonvolatile memory.

14. The method of claim 13, further comprising generating the deselect mapping.

15. The method of claim 14, wherein generating the deselect mapping comprises:
    gathering a data set for multiple sets of pixels or subpixels in a focal plane array exposed to light or radiation from a first known target;
    analyzing the data set for determining which of the pixels or subpixels to add to a deselect mapping; and
    adding pixels or subpixels to the deselect mapping based on the analysis.

16. The method of claim 15, wherein the analysis includes determining which pixels or subpixels have an output greater than a threshold.

17. The method of claim 15, further comprising gathering a second data set from multiple sets of the pixels or subpixels exposed to light or radiation from a second known target having a different temperature than the first known target, wherein the analysis includes using the data sets to determine which of the pixels or subpixels has a difference response lower than a first threshold, wherein the pixels or subpixels having a difference response lower than the first threshold are added to the deselect mapping.

18. The method of claim 17, wherein the analysis includes determining a noise value of the pixels or subpixels, and determining which pixels or subpixels have a noise level greater than a second threshold.

19. The method of claim 14, further comprising gathering a second data set from multiple sets of the pixels or subpixels exposed to light or radiation from a second known target having a different temperature than the first known target, wherein the analysis includes using the data sets to determine which of the pixels or subpixels has a difference response lower than the threshold, wherein the pixels or subpixels having a difference response lower than the threshold are added to the deselect mapping.

20. The method of claim 14, wherein the analysis includes determining a noise value of the pixels or subpixels, and determining which pixels or subpixels have a noise level greater than the threshold.

21. The method of claim 13, wherein the analysis includes determining a noise value of the pixels or subpixels, and determining which pixels or subpixels have a noise level greater than a threshold.

22. The method of claim 13, wherein focal plane array includes a layer of HgCdTe.

23. A method, comprising:
analyzing responses of pixels or subpixels of a focal plane array to a known target;
cooling the focal plane array prior to the analysis;
deselecting some of the pixels or subpixels based on the analysis;
exposing the focal plane array to light or radiation from a target of interest;
generating a target data set representative of the target of interest; and
outputting the target data set to at least a nonvolatile memory.

24. The method of claim 23, wherein the analysis includes determining which pixels or subpixels have an output greater than a threshold.

25. The method of claim 24, wherein the threshold is based at least in part on a statistical output level of at least some of the pixels or subpixels.

26. The method of claim 24, further comprising analyzing responses of pixels or subpixels of a focal plane array to a second known target having a different temperature than the first known target, wherein the pixels or subpixels having a difference response lower than a difference threshold are deselected.

27. The method of claim 26, wherein the analysis includes determining a noise value of the pixels or subpixels, and determining which pixels or subpixels have a noise level greater than a threshold.

28. The method of claim 24, wherein the analysis includes determining a noise value of the pixels or subpixels, and determining which pixels or subpixels have a noise level greater than a threshold.

29. The method of claim 23, further comprising gathering a second data set from multiple sets of the pixels or subpixels exposed to light or radiation from a second known target having a different temperature than the first known target, wherein the analysis includes using the data sets to determine which of the pixels or subpixels has a difference response lower than a threshold, wherein the pixels or subpixels having a difference response lower than the threshold are added to the deselect mapping.

30. The method of claim 23, wherein the analysis includes determining a noise value of the pixels or subpixels, and determining which pixels or subpixels have a noise level greater than a threshold.

31. The method of claim 23, wherein focal plane array includes a layer of HgCdTe.

32. A method, comprising:
analyzing responses of pixels or subpixels of a focal plane array to a known target;
deselecting some of the pixels or subpixels based on the analysis;
exposing the focal plane array to light or radiation from a target of interest;
generating a target data set representative of the target of interest; and
outputting the target data set to at least a nonvolatile memory,
wherein the analysis includes determining which pixels or subpixels have an output greater than a threshold,
wherein the threshold varies with spectral dispersion of the light or radiation.

33. The method of claim 32, further comprising cooling the focal plane array prior to the analysis.

* * * * *